United States Patent
Weng

(10) Patent No.: US 6,720,243 B2
(45) Date of Patent: Apr. 13, 2004

(54) BUMP FABRICATION METHOD

(75) Inventor: Chao-Fu Weng, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,292

(22) Filed: Jan. 6, 2003

(65) Prior Publication Data

US 2003/0129821 A1 Jul. 10, 2003

(30) Foreign Application Priority Data

Jan. 7, 2002 (TW) ........................... 91100098 A

(51) Int. Cl.⁷ ............................................... H01L 21/44
(52) U.S. Cl. ...................... 438/612; 438/613; 438/614; 438/615
(58) Field of Search ................................ 438/612, 613, 438/614, 615, 108

(56) References Cited

U.S. PATENT DOCUMENTS

| | | | |
|---|---|---|---|
| 5,767,010 A | * | 6/1998 | Mis et al. .................... 438/614 |
| 5,937,320 A | * | 8/1999 | Andricacos et al. ......... 438/614 |
| 6,232,212 B1 | * | 5/2001 | Degani et al. ............... 438/612 |
| 6,624,060 B2 | * | 9/2003 | Chen et al. .................. 438/613 |
| 2002/0173134 A1 | * | 11/2002 | Viswanadam et al. ....... 438/613 |
| 2003/0134498 A1 | * | 7/2003 | Chen et al. .................. 438/614 |
| 2003/0157438 A1 | * | 8/2003 | Tong et al. .................. 430/314 |
| 2003/0157789 A1 | * | 8/2003 | Tong et al. .................. 438/613 |

* cited by examiner

*Primary Examiner*—Lynne Gurley
(74) *Attorney, Agent, or Firm*—Jiang Chyun IP Office

(57) ABSTRACT

A method of fabricating bumps is disclosed. In the present method, prior to forming solder, layer pattern, the wetting layer and the barrier layer are removed, and after a solder layer pattern is formed, only the exposed adhesion layer is removed. The method can avoide etching the solder layer pattern in the course of etching the solder layer and the barrier layer, and therefore the volume of the required solder layer pattern can be maintained. Thus, the height of the bump after the re-flow process is maintained at an appropriate range and the required bonding force between the bump and the under ball metallurgy layer pattern can be maintained so as to improve the reliability.

13 Claims, 8 Drawing Sheets

BUMP FABRICATION METHOD

CROSS REFERENCE TO RELATED APPLICATIONS

This application claims the priority benefit of Taiwan application Ser. No. 91100098, filed Jan. 7, 2002.

BACKGROUND OF INVENTION

1. Field of the Invention

The present invention relates to a bump fabrication method, and in particular, a method of forming good quality bumps, avoiding etching the solder layer pattern after the exposed wetting layer, barrier layer, and adhesion layer have been removed.

2. Description of the Related Art

The so-called bump fabrication method commonly used in flip chip technology is the formation of Under Ball Metallurgy (UBM) on the external connection point on a wafer. A wafer bump is formed on the under ball metallurgy, and finally, the wafer bump is directly connected to the substrate.

General UBM is used as an interface between the bump and the pad and therefore, the UBM must possess low stress, good adhesion, strong corrosive resistance and excellent wetting properties. Normally, a UBM comprises three layers of metals. Each respectively improves the bonding between the metal and the adhesion layer, improves the wetting layer of the bump, and provides a barrier layer in between two layers. The function of the barrier layer is to prevent a particle of the adhesion layer from penetrating the wetting layer, or to avoid a particle of the wetting layer penetrating the adhesion layer.

In the conventional method of fabricating bumps, after a solder layer is electroplated, the solder layer is used as a mask, and an etching method is used to remove the wetting layer and the barrier layer, and then the adhesion layer. Finally, by employing a re-flow process, the solder layer is formed into a bump. However, in the course of removing the barrier layer, due to the nitric acid contained in the etching solution, the solder layer being used as a mask is also etched when the wetting layer and the barrier layer are removed.

When the solder layer is etched by the etching solution two problems will arise.

(1) If the etching solution etches the surface of the solder layer, the volume of the solder layer is insufficient so that the height difference of the bump after a re-flow process increases, and the object of the external connection of the bump may not be achieved.

(2) When the etching solution etches the bottom of the solder layer, the connection face between the solder layer and the UBM will decrease. This will reduce the bonding force between the solder layer and the UBM, and further, the solder layer may be stripped off.

A conventional method of fabrication bumps is described as follows: Referring to FIGS. 1 to 7, together with FIG. 8, wherein FIGS. 1 to 7 are sectional views showing the conventional method of fabricating bumps, and FIG. 8 is a flowchart block diagram showing a conventional method of fabricating bumps.

As shown in FIG. 1, the conventional method first provides a wafer 100 (S100 of FIG. 8) having a plurality of pads 102 and a passivation layer 104 covering the surface of the pad 102, and exposing the pad 102. On the surface of the wafer 100, an adhesion layer 106, a barrier layer 108, and a wetting layer 110 (S102 of FIG. 8) are formed. As shown in FIG. 2, a patterned photoresist layer 124 is formed to cover the surface (S104 of FIG. 8) of the wetting layer 110. This patterned photoresist layer 124 is provided with a plurality of openings 126 exposing the wetting layer 110.

As shown in FIG. 3, the openings 126 are electroplated with a solder layer 114 (S106 of FIG. 8).

FIG. 4 shows the removal of patterned photoresist layer 124 (S108 of FIG. 8). As shown in FIG. 5, the solder layer 114 is used as a mask to remove the wetting layer 110 and the barrier layer 108 (S110 of FIG. 8). Next, as shown in FIG. 6, the solder layer 114 is used as a mask to remove the adhesion layer 106 (S112 of FIG. 8). Finally, as shown in FIG. 7, a re-flow process (S114 of FIG. 8) is performed, and the solder layer 114 is formed into a bump 116, wherein the steps of S110 and S112 can be combined into a single step.

When the solder layer 114 is used as a mask to remove the wetting layer, the barrier layer and the adhesion layer (as shown in FIG. 6), due to the nitric acid contained in the etching solution, the solder layer will be etched and this will cause an insufficiency with respect to the volume of the solder layer, so that the height difference of the bump after a re-flow process increases, and the bonding force of the solder layer and the UBM is reduced, so that the solder layer may be stripped off.

SUMMARY OF INVENTION

Accordingly, it is an object of the present invention to provide a bump fabrication method, wherein in the course of etching the barrier layer, the solder layer will not be etched, and the height difference of the bump after a re-flow process is maintained to a limited range, and the bonding force between the bump and the UBM remains excellent, which provides excellent bump quality.

Another object of the present invention is to provide a bump fabrication method, comprising the steps of providing a wafer having a plurality of bump pads and a passivation layer on the surface of the wafer and exposing the bump pads; forming an adhesion layer, a barrier layer and a wetting layer in sequence on the surface of the wafer; defining the wetting layer and the barrier layer to form a plurality of Under Ball Metallurgy (UBM) patterns exposing the adhesion layer, wherein the UBM patterns correspond to each of the bump pads; forming a plurality of solder layer patterns on the surface of the UBM patterns, wherein each of the solder layer patterns corresponds to the UBM patterns; removing the exposed adhesion layer; and performing a re-flow process to form a bump on the solder layer pattern, wherein the wafer is provided with a plurality of pads, each UBM pattern respectively corresponding to each of the pads, and each solder layer pattern respectively corresponding to each of the UBM patterns.

In accordance with an aspect of the present invention, prior to forming the solder layer pattern, the wetting layer and the barrier layer are removed, and after a solder layer pattern is formed, only the exposed adhesion layer is removed, avoiding etching the solder layer pattern in the course of etching the solder layer and the barrier layer, and therefore the volume of the required solder layer pattern can be maintained. Thus, the height of the bump after the re-flow process is maintained at an appropriate range and the required bonding force between the bump and the under ball metallurgy layer pattern can be maintained so as to improve the reliability.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve the principles of the invention. In the drawings.

DETAILED DESCRIPTION

Figure 16:
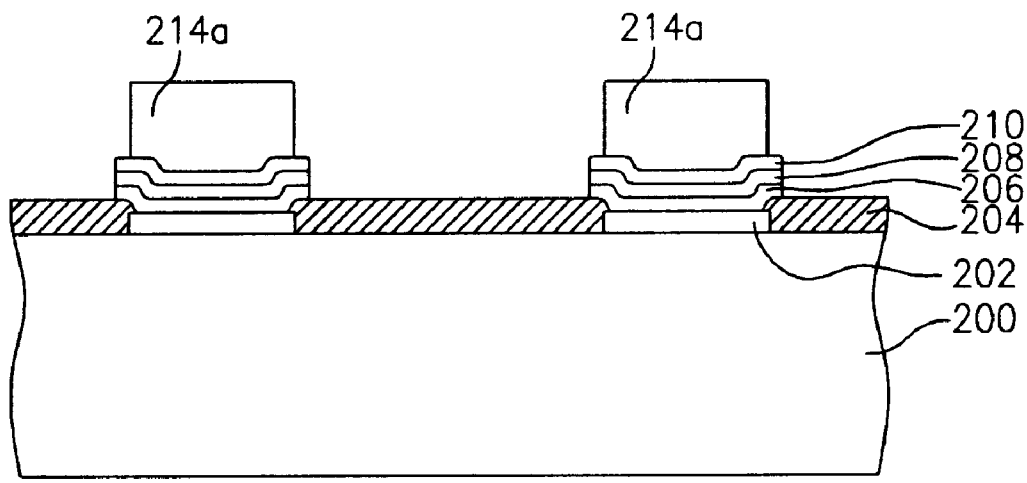
Figure 17:
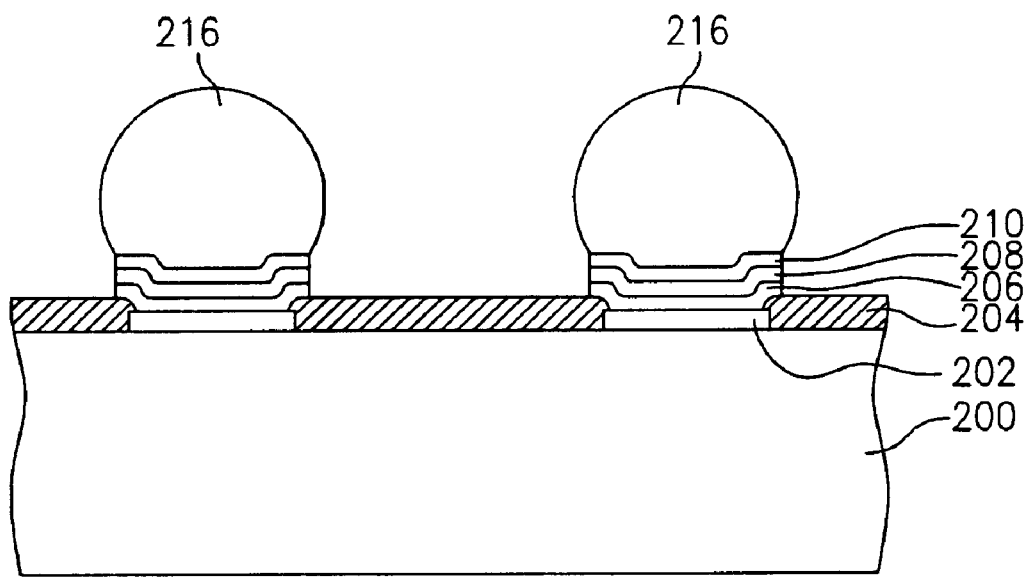
Figure 18:
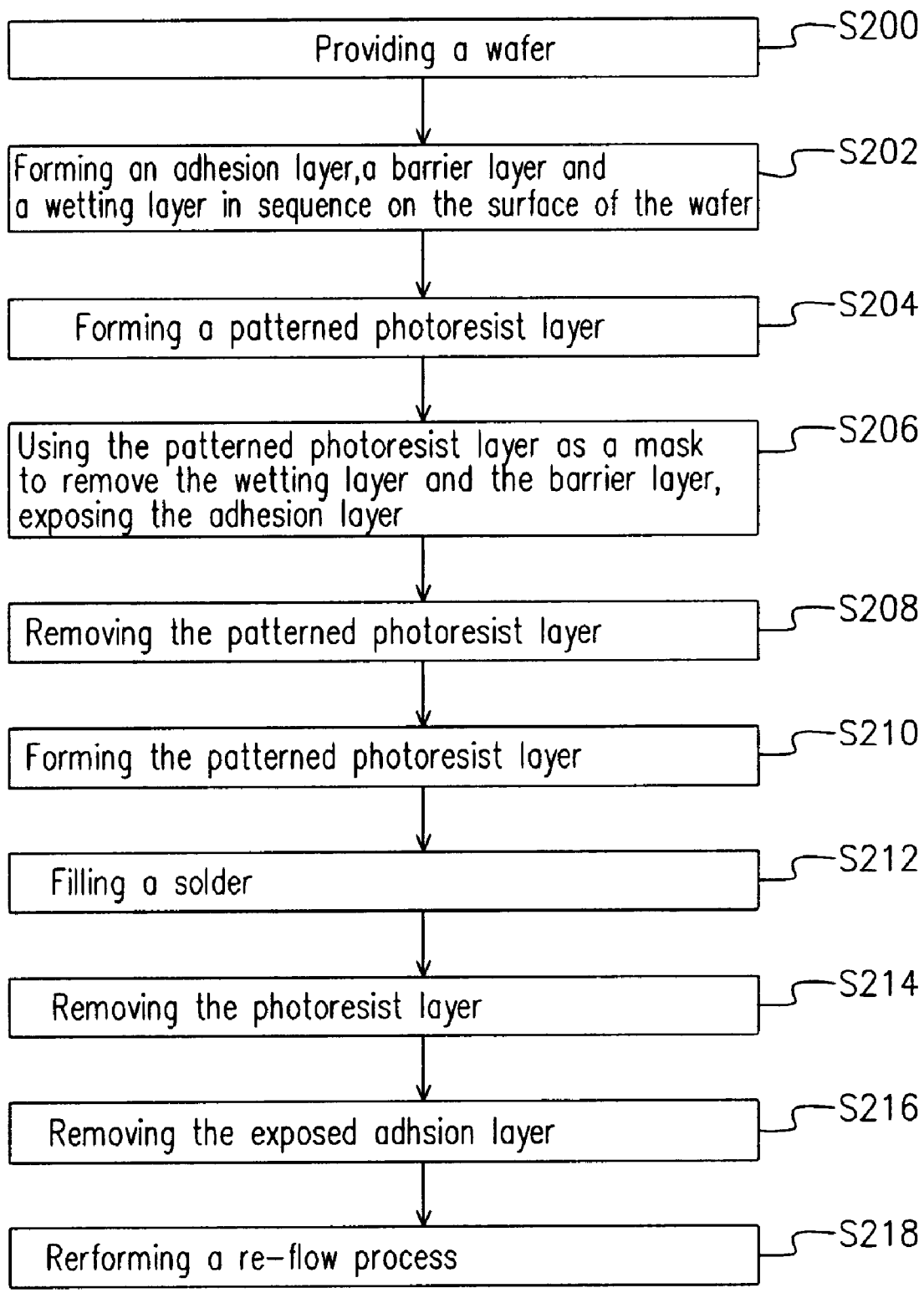
FIG. 18 is a flowchart block diagram showing the present preferred method of fabricating bumps in accordance with the present invention.

FIGS. 9 to 17, in combination with FIG. 18, show sectional views of a preferred method of fabricating bumps in accordance with the present invention. FIG. 18 is a block diagram flowchart showing a method of fabricating bumps in accordance with the present invention.

Figure 1:
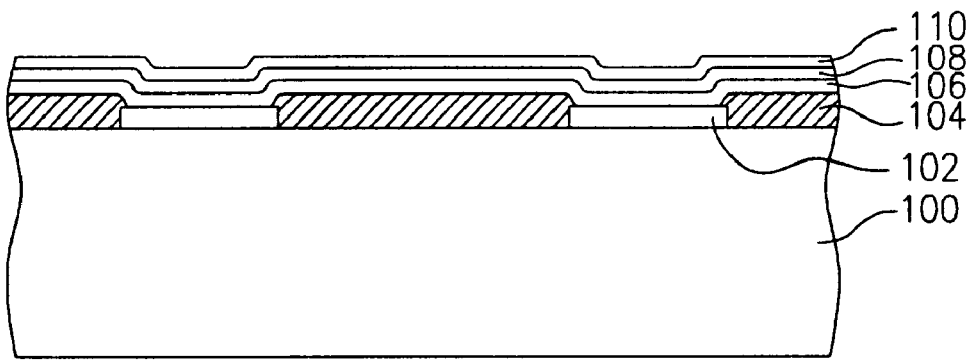
FIGS. 1 to 7 are sectional views showing the conventional method of fabrication bumps.
Figure 2:
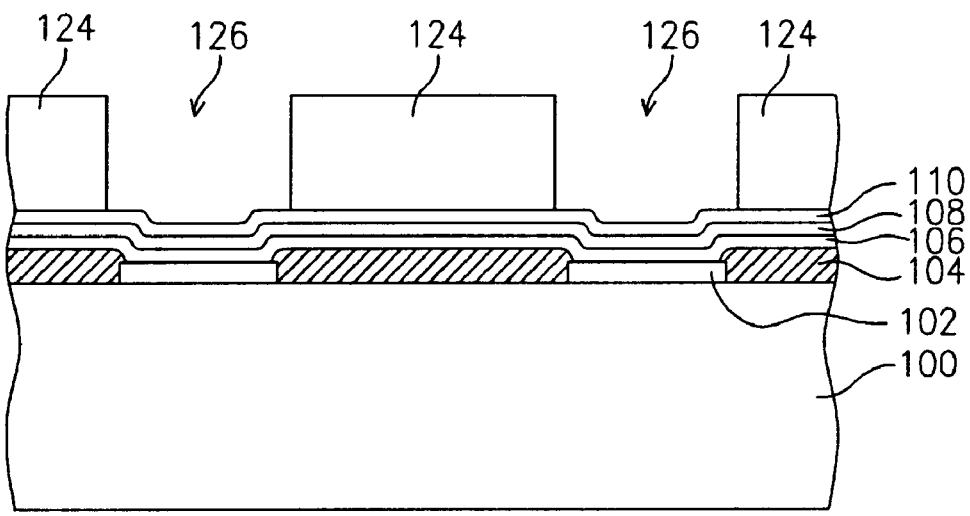
Figure 3:
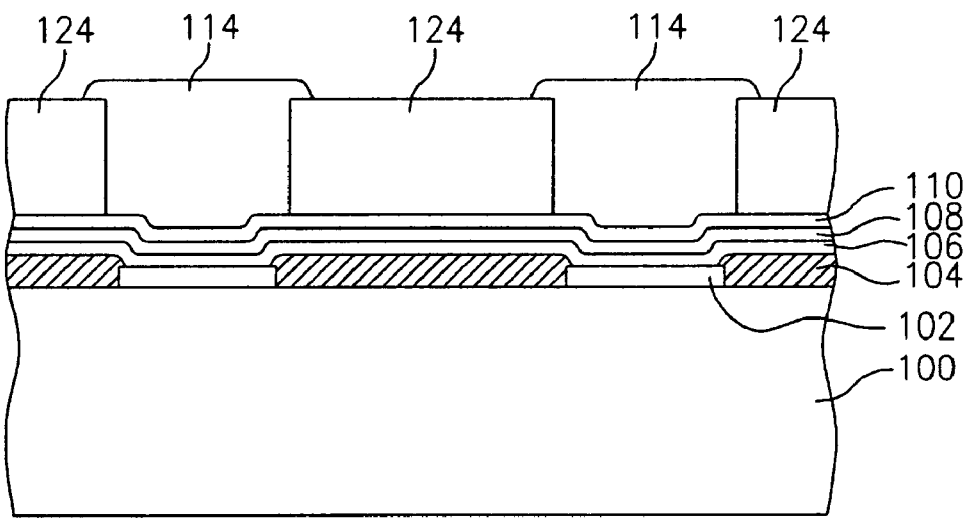
Figure 4:
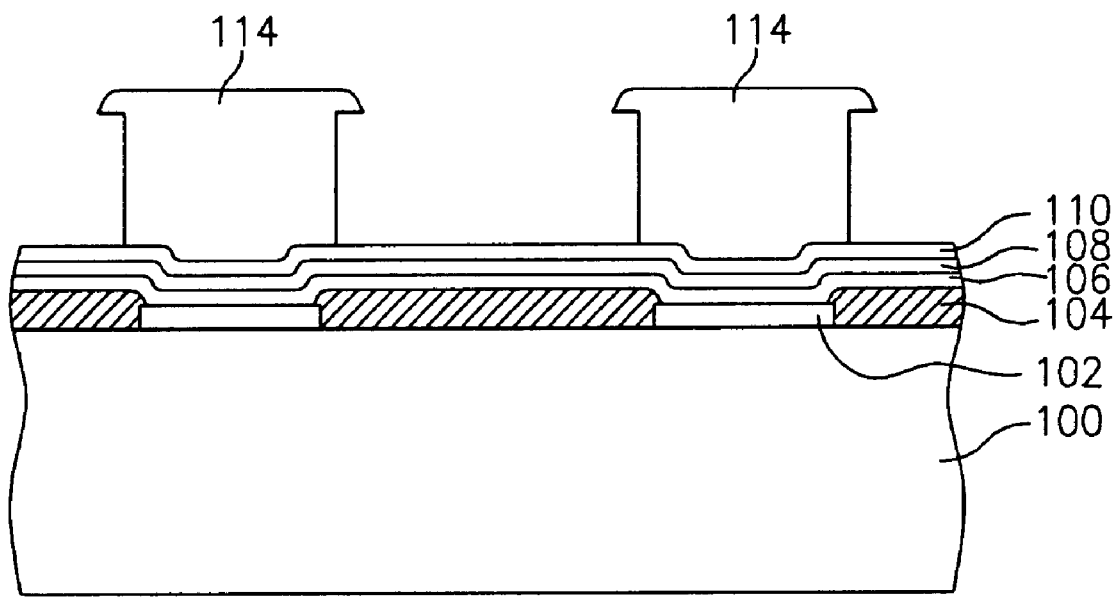
Figure 5:
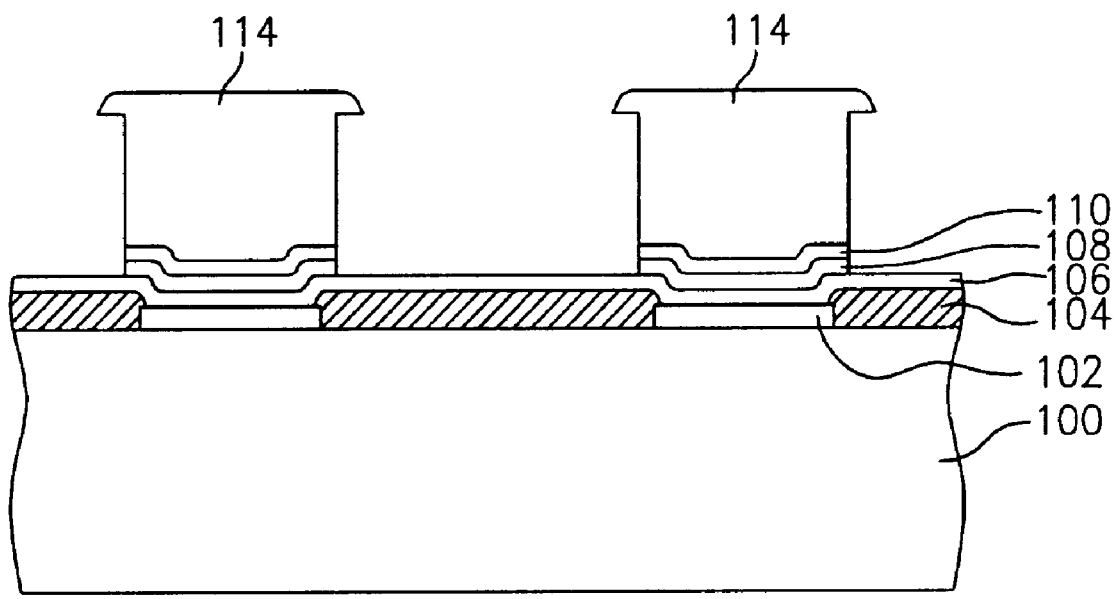
Figure 6:
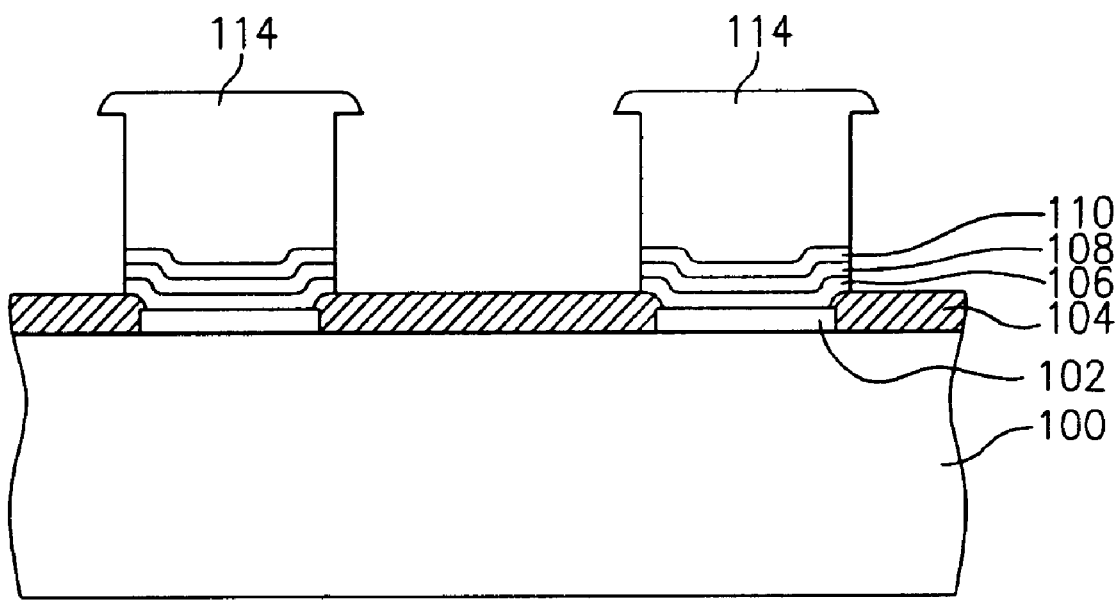
Figure 7:
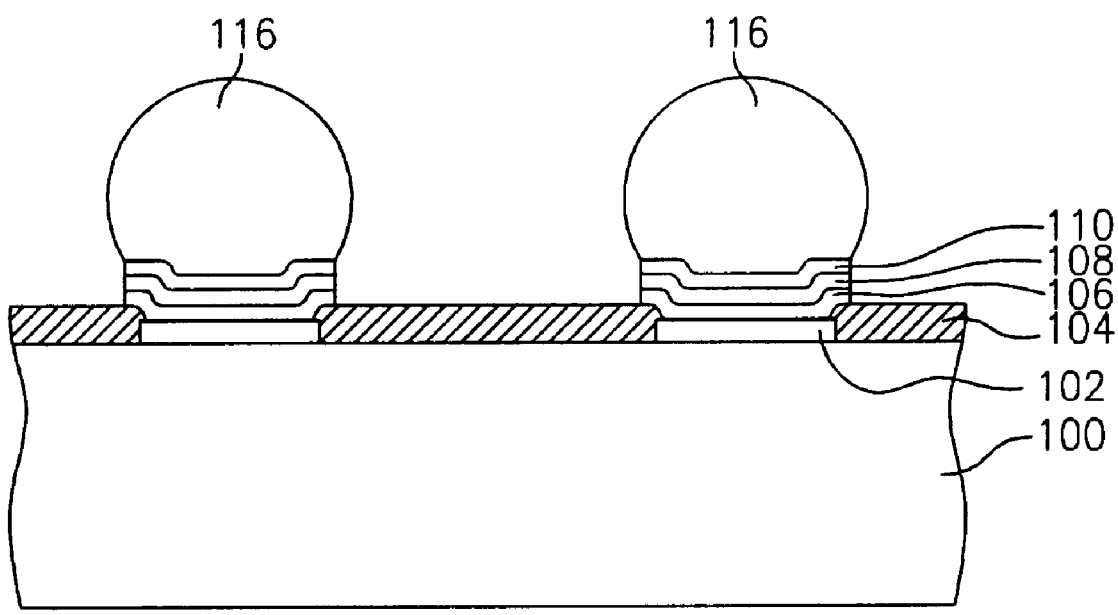
Figure 8:
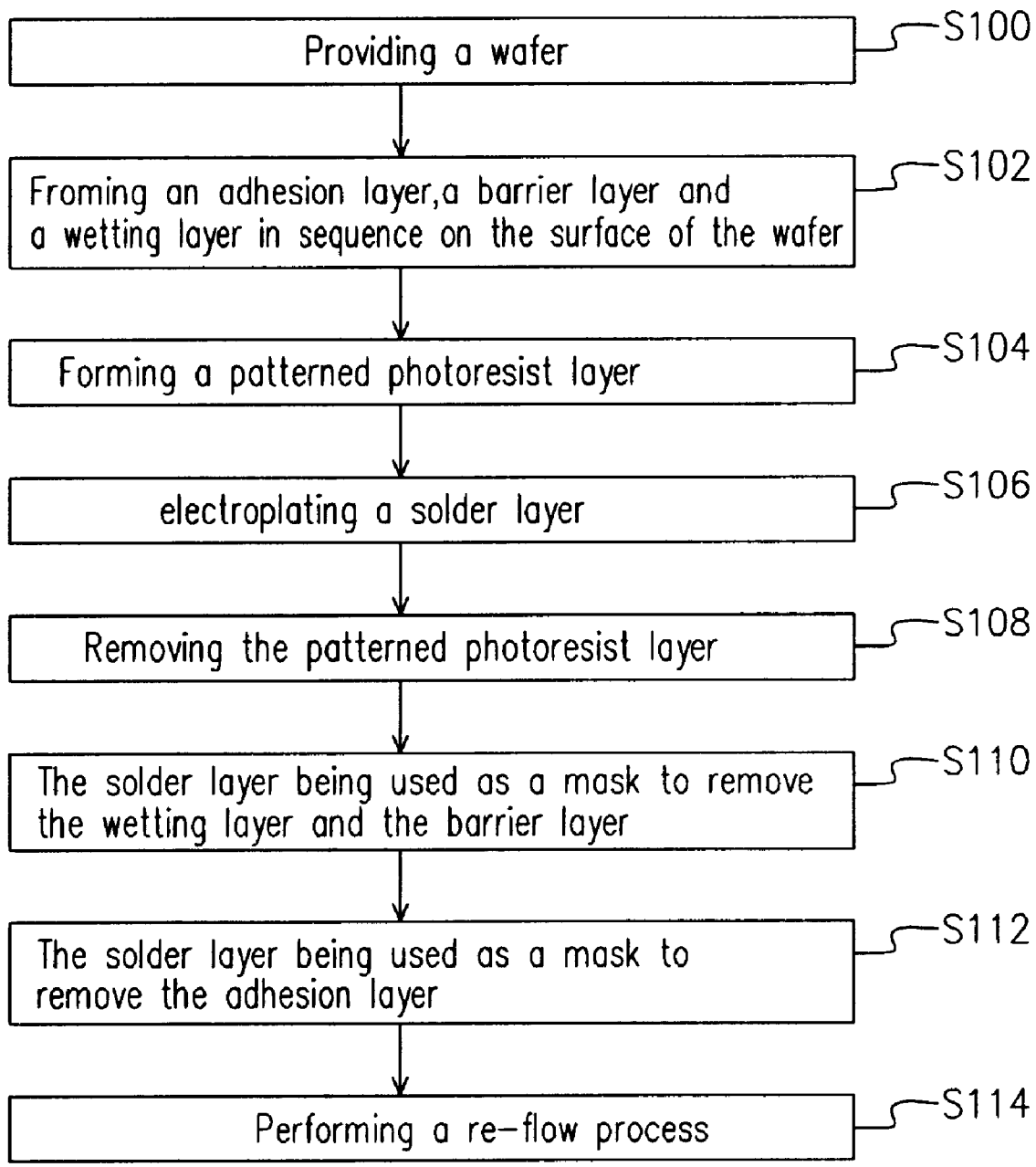
FIG. 8 is a flowchart block diagram showing the conventional method of fabricating bumps.
Figure 9:
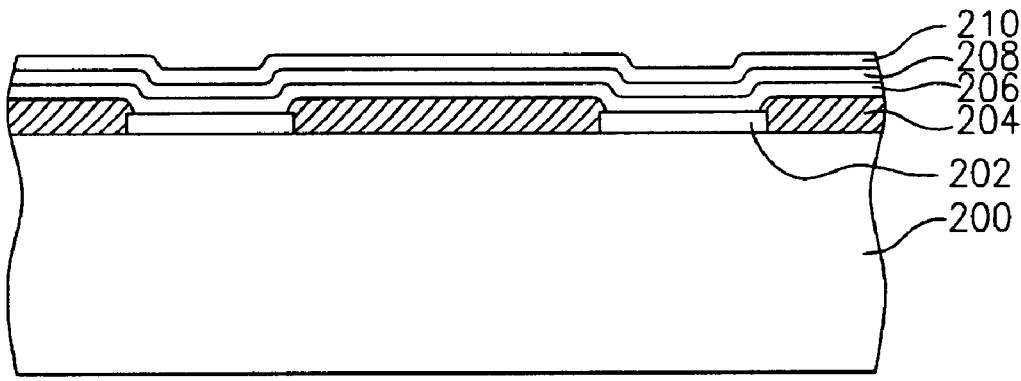
FIGS. 9 to 17 are sectional views showing the present preferred method of fabricating bumps in accordance with the present invention.

As shown in FIG. 9, the method of fabricating bumps comprises providing a wafer 200 (S200 as shown in FIG. 18) having a plurality of pads 202 and a passivation layer 204 covering the surface of the wafer 200 and exposing the pads 202, wherein the material of the passivation layer includes $SiO_2$, $Si_3N_4$ etc. Next, on the surface of the wafer 200, are formed an adhesion layer 206, a barrier layer 208 and a wetting layer 210 (S202 as shown in FIG. 18), wherein the material for the adhesion layer 206 includes Cr, Cu, Al or Ti etc., and the material for the barrier layer includes Ti—W alloy, Ti, Ni—V alloy, or Cr—Cu alloy etc. The material for the wetting layer includes Cu, Ni, Pd, Au, Ag or Pt, etc.

Figure 11:
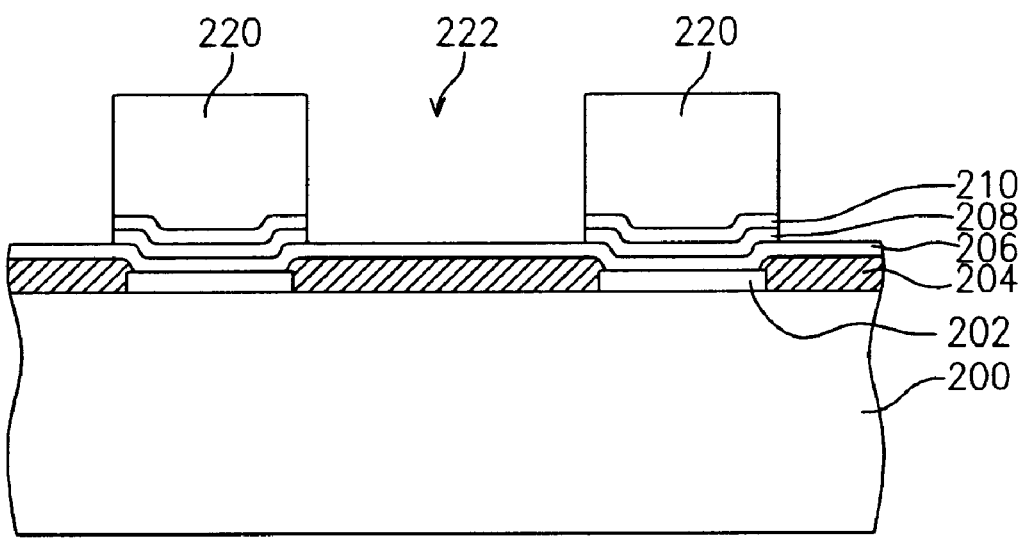
Figure 12:
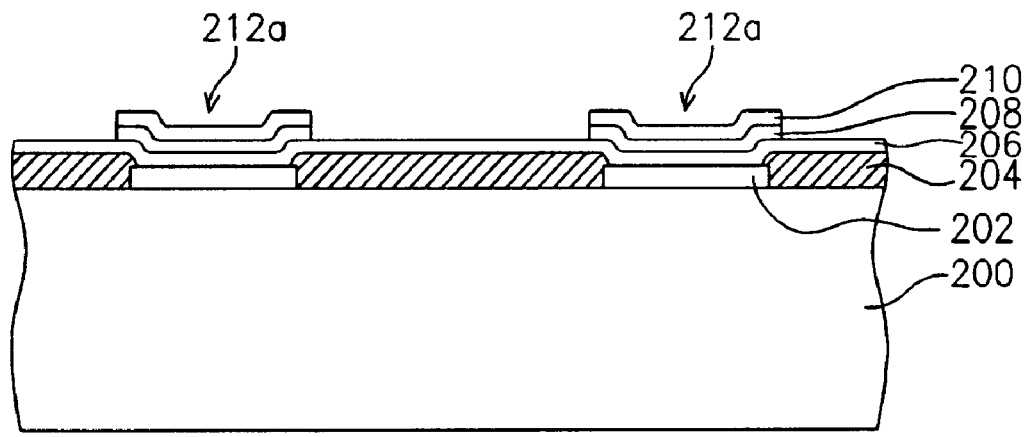

In FIG. 12, there is shown the defining of the wetting layer 206 and the barrier layer 208, forming into a plurality of under ball metallurgy patterns (UBM) 212a and exposing the adhesion layer 210, wherein each of the UBM patterns 212a is respectively corresponding to each of the pads 202. Here, the method of defining the wetting layer 206 and the barrier layer 208 is shown in FIGS. 10 to 12.

Figure 10:
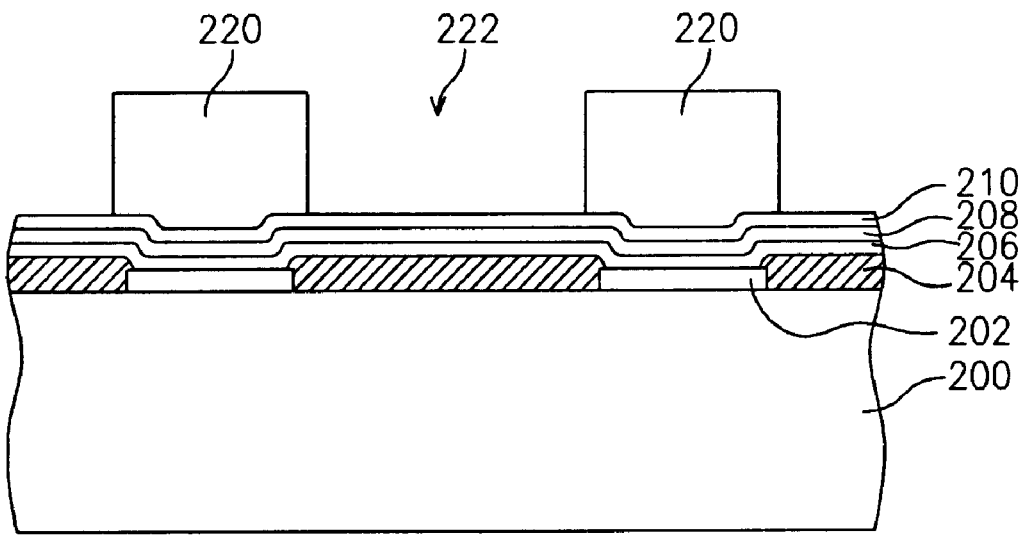

As shown in FIG. 10, there is shown the use of a photolithograghy method to form a patterned photoresist layer 220 (S204 of FIG. 18), covering the surface of the wetting layer 210, wherein the patterned photoresist layer 220 is provided with a plurality of openings 222, and the openings 222 expose the wetting layer 210. As shown in FIG. 11, there is shown the patterned photoresist layer 220 as a mask to remove the wetting layer 210 and the barrier layer 208, exposing the adhesion layer 206 (S206 of FIG. 18). Next, as shown in FIG. 12, the patterned photoresist layer 220 (S208 of FIG. 18) is removed.

Figure 14:
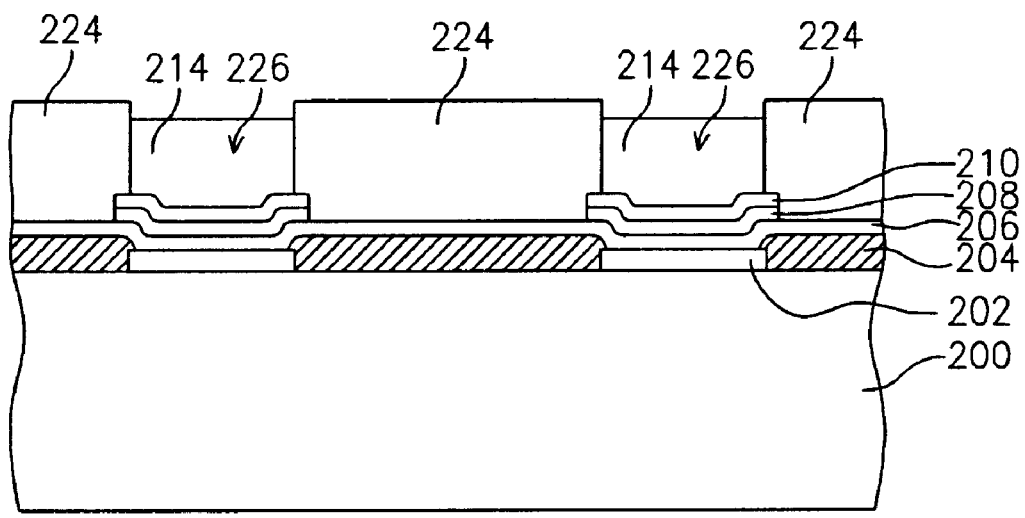
Figure 15:
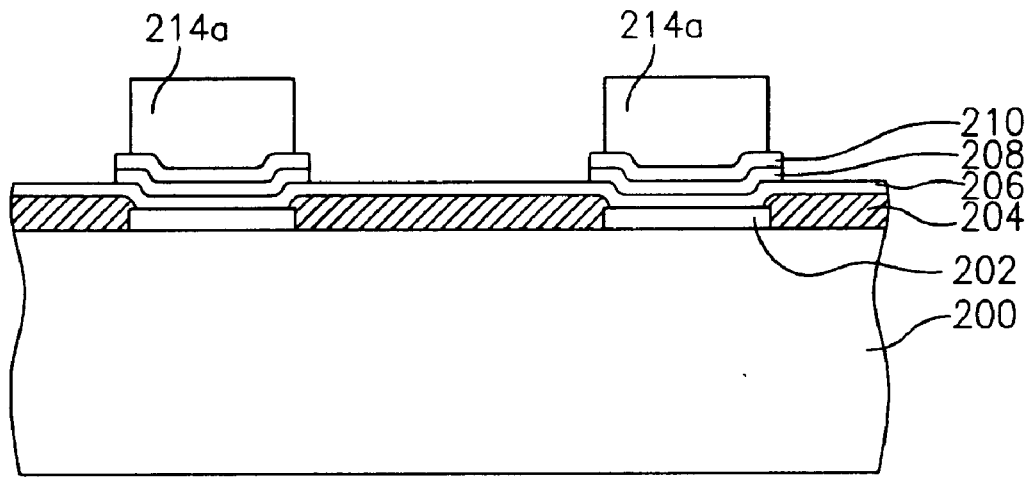

After that, as shown in FIG. 15, there is shown the formation of a plurality of solder layer patterns 214a on the surface of the UBM patterns 212a, wherein each of the solder layer patterns 214a respectively corresponds to each of the UBM patterns 212a. Here, the method of forming solder layer pattern 214a is shown in FIGS. 13 to 15.

Figure 13:
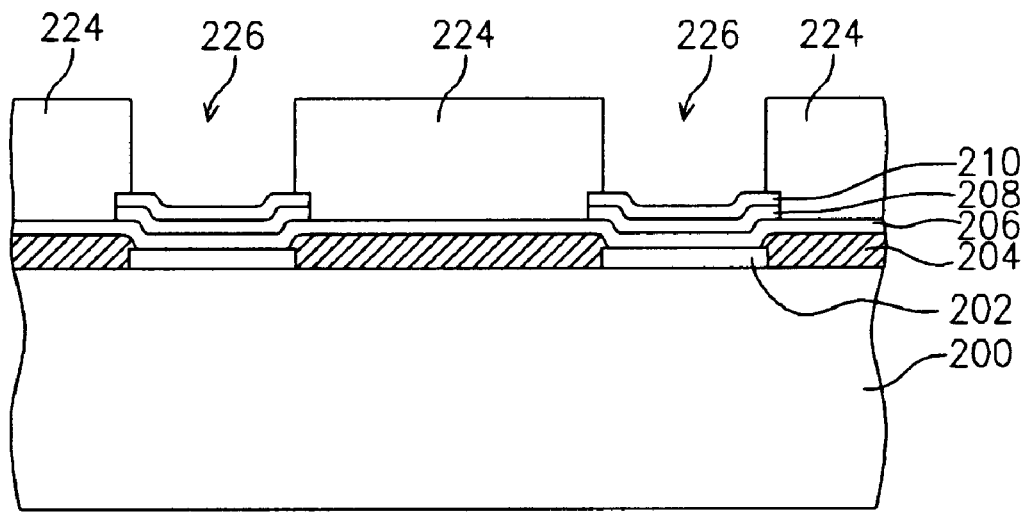

As shown in FIG. 13, there is shown a photolithography method to form a patterned photoresist layer 224 (S210 of FIG. 18) covering the exposed adhesion layer 206, wherein the patterned photoresist layer 224 is provided with a plurality of openings 226 and the openings 226 expose the UBM pattern 212a. As shown in FIG. 14, the printing method or electroplating method is used to fill a solder 214 into the openings 226 (S212 of FIG. 18), wherein the material of the solder 214 includes Sn—Pb alloy. Next, as shown in FIG. 15, the patterned photoresist layer 224 (S214 of FIG. 18) is removed to form into a plurality of solder layer patterns 214a.

Next, as shown in FIG. 16, the exposed adhesion layer 206 (S216) is removed, and finally, as shown in FIG. 17, the re-flow process (S218 of FIG. 18) is performed so that each of the solder layer patterns 214a is formed into a bump 216.

In accordance with the present invention, the wetting layer 210 and the barrier layer 208 are removed before the solder layer pattern 214a is formed, and after the formation of the solder layer pattern 214a, only the exposed adhesion layer 206 needs to be removed. Thus, the etching solution formulation used in the conventional bump formation does not need to be changed, and the problem of etching the solder layer pattern 214a can be avoided, and the volume of the required solder 214 can be maintained, and the height of the bump 216 after a re-flow process can be maintained at an appropriate range, and the required bonding force between the bump 216 and the UBM pattern 212a is maintained. Thus, the reliability of the fabrication method is improved.

In accordance with the characteristics of the present invention, the wetting layer 210 and the barrier layer 208 are removed first and the adhesion layer 206 is remains, which is then used to fill the solder 214 by means of an electroplating process.

In accordance with the present invention, after the wetting layer 210 and the barrier layer 208 are removed, the remaining adhesion layer 206 assists the removal of the patterned photoresist layer 224 (this is because the bonding of the patterned photoresist layer 224 and the adhesion layer 206 is weaker than that of the patterned photoresist layer 224 and the passivation layer 204).

In view of the above preferred embodiment, the present invention possesses the following advantages:

The method of fabricating bumps does not need to change the etching solution formulation employed in the conventional method of fabricating bumps, however the present invention avoids the problem of etching the solder layer. Thus, the required volume of the solder is maintained, and the height of the bumps after a re-flow process is maintained within an appropriate range, and the bonding force between the bump and the UBM pattern is maintained. As a result, reliability of the fabrication method is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

I claim:

1. A method of fabricating bumps comprising the steps of:
    providing a wafer having a plurality of bump pads and a passivation layer on the surface of the wafer and exposing the bump pads;
    forming an adhesion layer, a barrier layer and a wetting layer in sequence on the surface of the wafer;
    defining the wetting layer and the barrier layer to form a plurality of Under Bump Metallurgy (UBM) patterns exposing the adhesion layer, wherein the UBM patterns correspond to each of the bump pads; then,
    forming a plurality of solder layer patterns on the surface of the UBM patterns, wherein each of the solder layer patterns corresponds to each of the UBM patterns; then, removing the exposed adhesion layer after forming the plurality of solder layer patterns; and performing a reflow process to form a plurality of bumps transformed from the solder layer patterns after the exposed adhesion layer is removed.

2. The method of claim 1, wherein the adhesion layer material includes one selected from the group consisting of Cr, Cu, Al and Ti.

3. The method of claim 1, wherein the barrier layer material includes one selected from the group consisting of Ti—W alloy, Ti, Ni—V alloy, and Cr—Cu alloy.

4. The method of claim 1, wherein the wetting layer material includes one selected from the group consisting of Cu, Ni, Pd, Au, Ag, and Pt.

5. The method of claim 1, wherein the passivation layer includes $SiO_2$.

6. The method of claim 1, wherein the passivation layer includes $Si_3N_4$.

7. A method of claim 1, wherein the step of defining the wetting layer and the barrier layer comprises the steps of:

forming a patterned photo-resist layer covering the surface of the wetting layer, the patterned photo-resist layer having a plurality of openings, the openings respectively expose the wetting layer;

removing the exposed wetting layer and the barrier layer to expose the adhesion layer; and removing the patterned photo-resist layer.

8. The method of claim 7, wherein the method of forming pattern photo-resist layer includes photolithography.

9. The method of claim 1, wherein the step of forming the solder layer pattern comprises the steps of:

forming a patterned photo-resist layer covering the exposed adhesion layer, the patterned photo-resist layer having a plurality of openings, the openings respectively exposing the UBM pattern; and filling a solder into the opening; and removing the patterned photo-resist layer.

10. The method of claim 9, wherein the method of filling solder includes electroplating.

11. The method of claim 9, wherein the method of filling solder includes printing.

12. The method of claim 9, wherein the solder includes Sn—Pb alloy.

13. The method of claim 9, wherein the method of forming the patterned photo-resist layer includes photolithography.

* * * * *